US009130700B2

(12) United States Patent
Norsworthy et al.

(10) Patent No.: US 9,130,700 B2
(45) Date of Patent: Sep. 8, 2015

(54) NOISE SHAPED INTERPOLATOR AND DECIMATOR APPARATUS AND METHOD

(71) Applicant: STMicroelectronics, N.V., Plan-les-Ouates, Geneva (CH)

(72) Inventors: Steven R. Norsworthy, Ardiff, CA (US); Jason Rupert Redgrave, Mountain View, CA (US)

(73) Assignee: STMicroelectronics N.V., Amsterdam (NL)

( * ) Notice: Subject to any disclaimer, the term of this patent is extended or adjusted under 35 U.S.C. 154(b) by 0 days.

(21) Appl. No.: 14/295,233

(22) Filed: Jun. 3, 2014

(65) Prior Publication Data
US 2014/0286467 A1 Sep. 25, 2014

Related U.S. Application Data

(62) Division of application No. 13/211,054, filed on Aug. 16, 2011, now Pat. No. 8,744,032, which is a division of application No. 10/910,910, filed on Aug. 3, 2004, now Pat. No. 8,019,035.

(60) Provisional application No. 60/493,041, filed on Aug. 5, 2003, provisional application No. 60/496,320, filed on Aug. 18, 2003.

(51) Int. Cl.
*H03L 7/16* (2006.01)
*H04B 1/06* (2006.01)
(Continued)

(52) U.S. Cl.
CPC .......... *H04L 7/0008* (2013.01); *H03H 17/0614* (2013.01); *H03H 17/0628* (2013.01); *H04L 7/005* (2013.01); *H04L 7/02* (2013.01); *H03H 2218/04* (2013.01)

(58) Field of Classification Search
CPC ..... H04L 7/0012; H04L 7/0008; H04L 7/005; H04L 7/02; H04B 1/38; H04B 1/00; H04B 1/06; H03L 7/16; H03M 3/30; H03H 17/0614; H03H 17/0628; H03H 2218/04
See application file for complete search history.

(56) References Cited

U.S. PATENT DOCUMENTS 4,414,687 A * 11/1983 Hirata .................... 455/165.1
4,596,026 A    6/1986 Cease et al.
(Continued)

FOREIGN PATENT DOCUMENTS

EP    0512619 B1    8/1997

OTHER PUBLICATIONS

Keyzer, et al.; "Digital Generation fo RR Signals for Wireless Communications with Band-Pass Delta-Sigma Modulation"; IEEE; 2001; 4 pp.

(Continued)

*Primary Examiner* — Jean B Corrielus
(74) *Attorney, Agent, or Firm* — Gardere Wynne Sewell LLP

(57) ABSTRACT

Interpolator and decimator apparatuses and methods are improved by the addition of an elastic storage element in the signal path. In one exemplary embodiment, the elastic element comprises a FIFO which advantageously allows short term variation in sample clocks to be absorbed, and also provides a feedback mechanism for controlling a delta-sigma modulated modulo-N counter based sample clock generator. The elastic element combined with a delta-sigma modulator and counter creates a noise-shaped frequency lock loop without additional components, resulting in a much simplified interpolator and decimator.

19 Claims, 12 Drawing Sheets

(51) Int. Cl.
*H04L 7/00* (2006.01)
*H03H 17/06* (2006.01)
*H04L 7/02* (2006.01)

(56) References Cited

U.S. PATENT DOCUMENTS

| | | | |
|---|---|---|---|
| 5,220,327 A | 6/1993 | Abbiate et al. | |
| 5,497,152 A | 3/1996 | Wilson et al. | |
| 5,497,405 A | 3/1996 | Elliott et al. | |
| 5,555,524 A | 9/1996 | Castellano | |
| 5,650,951 A | 7/1997 | Staver | |
| 5,699,391 A | 12/1997 | Mazzurco et al. | |
| 5,757,871 A | 5/1998 | Furukawa et al. | |
| 5,802,462 A * | 9/1998 | Lautzenhiser | 455/208 |
| 5,835,543 A | 11/1998 | Mazzurco et al. | |
| 5,880,980 A | 3/1999 | Rothacher et al. | |
| 6,005,901 A | 12/1999 | Linz | |
| 6,061,410 A | 5/2000 | Linz | |
| 6,141,671 A | 10/2000 | Adams et al. | |
| 6,188,288 B1 * | 2/2001 | Ragan et al. | 331/16 |
| 6,192,220 B1 * | 2/2001 | Henwood et al. | 455/76 |
| 6,215,423 B1 | 4/2001 | May et al. | |
| 6,366,622 B1 | 4/2002 | Brown et al. | |
| 6,577,693 B1 | 6/2003 | Wolf | |
| 6,611,570 B1 | 8/2003 | Subramanian | |
| 6,653,958 B1 | 11/2003 | Morche | |
| 6,714,886 B2 | 3/2004 | Sung et al. | |
| 6,785,556 B2 | 8/2004 | Souissi | |
| 6,888,580 B2 * | 5/2005 | Dujmenovic | 348/731 |
| 6,915,318 B2 | 7/2005 | Mueller | |
| 6,999,132 B1 | 2/2006 | Adams et al. | |
| 7,006,024 B2 | 2/2006 | Keaveney et al. | |
| 7,180,914 B2 | 2/2007 | Walker et al. | |
| 7,295,578 B1 * | 11/2007 | Lyle et al. | 370/503 |
| 7,298,808 B1 | 11/2007 | Rey | |
| 2002/0129073 A1 | 9/2002 | Page et al. | |
| 2003/0107507 A1 | 6/2003 | Wang et al. | |
| 2003/0137359 A1 * | 7/2003 | Patana | 331/100 |
| 2003/0154045 A1 | 8/2003 | Sung et al. | |
| 2004/0165691 A1 * | 8/2004 | Rana | 377/48 |
| 2004/0266365 A1 * | 12/2004 | Hasson et al. | 455/91 |
| 2006/0035597 A1 | 2/2006 | Lin et al. | |
| 2006/0080566 A1 | 4/2006 | Sherburne, Jr. | |
| 2007/0041435 A1 | 2/2007 | Sorrells et al. | |

OTHER PUBLICATIONS

International Search Report dated Jan. 25, 2005 in connection wtih International Application Serial No. PCT/US04/25323.
Rothacher; "Sample-Rate Conversion: Algorithms and VLSI Implementation"; ETH No. 10980; Swiss Federal Institute of Technology; Zurich; 1995; 153 pp.
Supplemental Partial European Search Report dated Mar. 25, 2009 in connection with European Patent Application No. EP 04780201.

\* cited by examiner

NOISE SHAPED INTERPOLATOR AND DECIMATOR APPARATUS AND METHOD

PRIORITY

This application is a division of U.S. patent application Ser. No. 13/211,054 filed Aug. 16, 2011, now U.S. Pat. No. 8,744,032, which is a division of U.S. patent application Ser. No. 10/910,910 filed Aug. 3, 2004, now U.S. Pat. No. 8,019,035, and claims the benefit of U.S. Provisional Patent Applications Nos. 60/493,041 filed Aug. 5, 2003 and 60/496,320 filed Aug. 18, 2003, each entitled "NOISE SHAPED INTERPOLATOR AND DECIMATOR APPARATUS AND METHOD." Each of the above-referenced patent documents is incorporated herein by reference in its entirety.

TECHNICAL FIELD

The present disclosure relates generally radio frequency signals, and specifically for AN efficient apparatus and methods for radio frequency (RF) signal transmission, reception, and modulation.

DESCRIPTION OF RELATED TECHNOLOGY

In theory, digital sample rate conversion between two different clock rates can be performed without introduction of sample error (phase noise) if the two sample frequencies are related by a rational ratio. This is typically accomplished by interpolating to the lowest frequency that is a multiple of both the source and sink sample rates, and then decimating to the required sink sample rate. If the two sample rates are not rationally related, as will be the case at least part of the time if they are varying with respect to one another, then phase noise will be introduced even if the source and sink sample clocks are ideal. In practice, jitter on the source and sink clocks result in the introduction of phase noise even if the rates are related rationally, so noise-shaped delta-sigma modulated fractional-N ("Frac-N") sample rate converters are often the best choice even when the source and sink clocks are rationally related.

Fractional rate interpolators create an effective interpolation rate that is the average of a series of integer hold values. For example, a fractional interpolation rate of 7.5 could be created by alternating 7 cycle sample-holds with 8 cycle sample-holds. Sequence repetition such as this would, however, create significant tones in the spectral response of the interpolator. If instead a random sequence of 7's and 8's was chosen, with an equal number of 7's and 8's on average, then the same fractional interpolation rate would be achieved, but the quantization error would appear as noise spread across the spectrum instead of the more discrete tones produced by the alternating scheme previously described.

Delta-sigma modulated fractional-N interpolators operate on this principle, except that rather than generate a random stream of 7's and 8's (in the context of the foregoing example), the stream is generated to shape the quantization noise spectrally such that it is reduced in the frequencies of interest, and appears at frequencies that are easily filtered. The principles of delta-sigma modulation are well known in the signal processing arts and are described in, e.g., "Delta-Sigma Data Converters—Theory, Design and Simulation", Norsworthy, et al., IEEE Press, 1997.

Both Integer and Fractional-N digital sample rate converters have been described in the literature; see U.S. Pat. No. 5,497,152 issued Mar. 5, 1996 and entitled "Digital-to-Digital Conversion Using Non-Uniform Sample Rates" which is incorporated herein by reference in its entirety; and "Sample-Rate Conversion: Algorithms and VLSI Implementation", Diss. ETH No. 10980, Swiss Federal Institute of Technology, Zurich (1995), also incorporated herein by reference in its entirety. Many issues associated with tracking source and sink clocks have also been addressed in the prior art.

The above-referenced solutions, however, have several drawbacks associated therewith. Most notably, each requires a complete digital phase lock loop (PLL) in addition to the interpolator in order to provide the desired tracking between source and sink clock domains. This PLL arrangement is costly in terms of additional complexity and power consumption. It also reduces the robustness of the interpolator device as a whole. What would be ideal is a solution where the PLL could be obviated in favor of a simpler and less power-consumptive architecture.

Additionally, prior art solutions do not provide the ability to dynamically adapt the operation of the interpolator (or decimator) as a function of operational conditions or parameters, such as transmitter power. Such prior art interpolators also generate significant phase noise which may undesirably fall within certain bands of interest, thereby degrading the performance of the parent device (e.g., RF transmitter).

SUMMARY

The present disclosure satisfies the aforementioned needs by providing an improved apparatus and methods for digital interpolation, decimation and sample rate conversion.

In a first aspect of the disclosure, an improved interpolator apparatus useful in a communications circuit is disclosed, comprising: an elastic storage element; a filter; and a delta-sigma modulator. In one embodiment, the interpolator uses the elastic storage element to buffer or absorb sample rate variations occurring between two different clock or data domains. A low pass filter (LPF) filters the error signal related to the difference between the two domains; this filtered signal acts as an input to the delta-sigma modulator. The modulator output is input to a modulo-N counter, the output of which is used to adjust the sample rate in the asynchronous (e.g., read) domain.

In a second aspect of the disclosure, improved decimator apparatus useful in a communications circuit is disclosed, comprising: an elastic storage element; a filter; and a delta-sigma modulator. In one embodiment, the decimator uses the elastic storage element to buffer or absorb sample rate variations occurring between two different clock or data domains, akin (but for the decimation function) to the interpolator described above. A low pass filter (LPF) filters the error signal related to the difference between the two domains; this filtered signal acts as an input to the delta-sigma modulator. The modulator output is input to a modulo-N counter, the output of which is used to adjust the sample rate in the asynchronous (e.g., write) domain.

In a third aspect of the disclosure, improved radio frequency apparatus including a fractional oscillator having a modulus update frequency is disclosed. In one embodiment, the oscillator comprises a delta-sigma phase-locked loop (PLL). The radio frequency apparatus utilizes a transmit frequency and receive frequency, and the PLL utilizes a modulus update frequency comprising a multiple or sub-multiple of an offset between the receive frequency and the transmit frequency. The modulus update frequency can also be dynamically varied as a function of at least one parameter such as transmitter power, and/or the order of the delta-sigma PLL (where a variable-order device is used).

In a fourth aspect of the disclosure, a method of suppressing phase noise in a radio frequency device having a transmit frequency and receive frequency is disclosed. In one embodiment, the method comprises: providing a delta-sigma Frac-N phase lock loop (PLL) having a modulus; and updating the modulus at a frequency comprising a multiple or sub-multiple of an offset between the receive frequency and transmit frequency. The updating reduces the presence of phase noise generated by the PLL at the receive frequency.

In a fifth aspect of the disclosure, a method of operating a fractional-N interpolator apparatus comprising a delta-sigma modulator, first and second clock domains, and an elastic buffer disposed operatively between the clock domains is disclosed. In one embodiment, the method comprises: clocking data into the buffer using the first clock domain; generating an error signal related to the difference between the first and second clock domains; filtering the error signal; modulating the filtered error signal; and generating a clock period signal based at least in part on the modulated filtered signal. Data is read from the elastic buffer in an asynchronous fashion based at least in part on the clock period signal.

In a sixth aspect of the disclosure, a method of operating a fractional-N interpolation or decimation apparatus comprising a delta-sigma modulator, first and second clock domains, one of the clock domains operating at a speed greater than the other, is disclosed. In one embodiment, the method comprises asynchronously clocking data out of or into an elastic storage element disposed between the two clock domains based at least in part on a signal generated by the delta-sigma modulator and counter.

In a seventh aspect of the disclosure, improved radio frequency transceiver apparatus is disclosed. In one embodiment, the apparatus comprises: a baseband processor adapted to process a plurality of baseband data; and a transmitter comprising a delta-sigma modulator fractional-N interpolator. The transmitter comprises a direct conversion transmitter adapted to convert directly from baseband to carrier frequency, and includes a resonator. The interpolator comprises an elastic storage element, low-pass filter and modulo counter, the storage element, filter, modulator and counter cooperating to elastically buffer variations in sampling rates between an input domain and output domain of the interpolator. The interpolator and transmitter also cooperate to suppress phase noise within at least one frequency band other than a frequency band used by the transmitter.

BRIEF DESCRIPTION OF THE DRAWINGS

The features, objectives, and advantages of the disclosure will become more apparent from the detailed description set forth below when taken in conjunction with the drawings, wherein.

DETAILED DESCRIPTION

Figure 1:
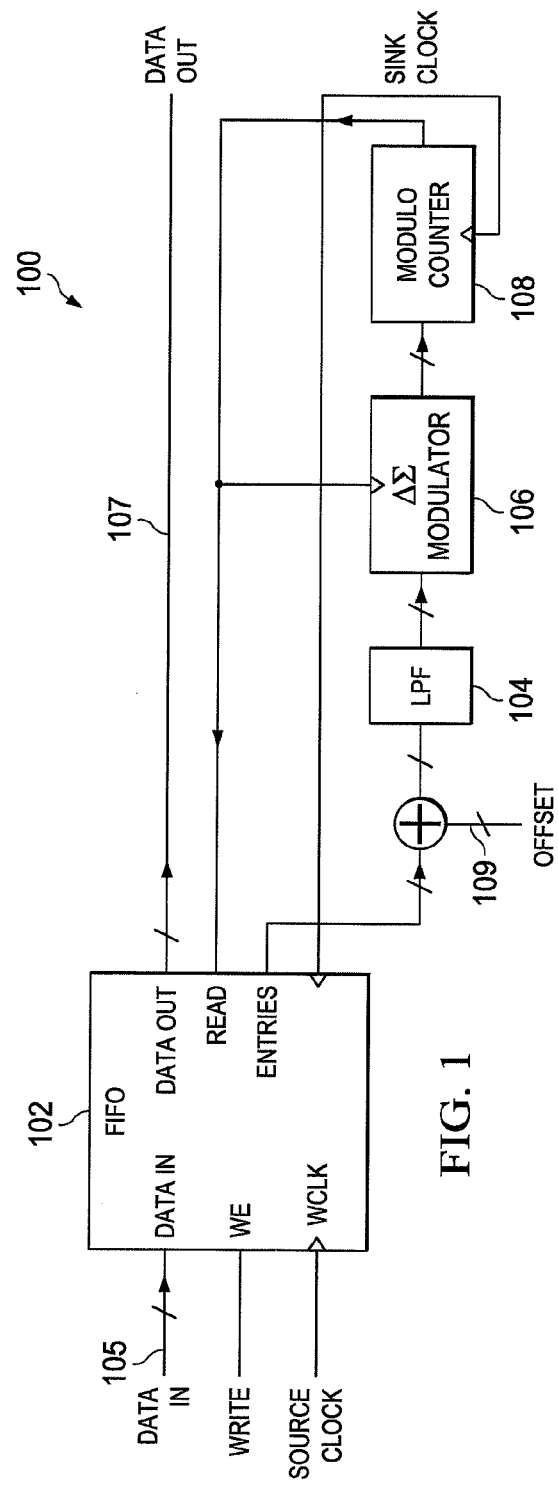
FIG. 1 is a schematic (circuit) diagram of an exemplary embodiment of an interpolator circuit according to the present disclosure.

Reference is now made to the drawings wherein like numerals refer to like parts throughout.

As used herein, the term "code division multiple access," or CDMA, generally refers to digital wireless technology that uses a spread spectrum technique to disperse a signal across a wide range of frequencies, such as according to a pseudo-noise or other code.

As used herein, the terms "transmit," "transmission" and "transmitting" for convenience may generally be considered to refer to both the acts of transmitting signals and receiving signals, as applicable.

As used herein, the term "processor" is meant generally to include all types of data or signal processing devices including, without limitation, digital signal processors (DSPs), reduced instruction set computers (RISC), general-purpose (CISC) processors, microprocessors, gate arrays (e.g., FPGAs), Reconfigurable Compute Fabrics (RCFs), and application-specific integrated circuits (ASICs). Such digital processors may be contained on a single unitary IC die, or distributed across multiple components.

As used herein the terms "memory," "storage element," and "storage device" are meant to include any means for storing data or information, including, without limitation, RAM (e.g., SRAM, SDRAM, DRAM, SDRAM, EDR-DRAM, DDR), ROM (e.g., PROM, EPROM, EEPROM, UV-EPROM), magnetic bubble memory, optical memory, embedded flash memory, etc.

Overview

The present disclosure provides, inter alia, an improved interpolator and decimator architectures having simplicity as well as increased efficiency. These benefits are largely afforded through the use of one or more "elastic" storage elements (e.g., an asynchronous FIFO) in the signal path, which can obviate the digital phase lock loop (PLL) or other comparable components under the prior art.

The addition of an elastic storage element in the signal path according to the present disclosure advantageously allows short term variation in sample clocks to be absorbed, and also provides a feedback mechanism for controlling a delta-sigma modulated modulo-N counter based sample clock generator. In essence, the elastic element(s) (e.g., FIFO(s)) combined with a delta-sigma modulator and counter creates a noise-shaped frequency-lock loop without additional components, resulting in a much simplified interpolator or decimator as compared to prior art solutions. This not only reduces the complexity and cost of any parent device (e.g., wireless handset, etc.) using this architecture, but also increases its robustness and efficiency.

Exemplary Interpolator/Decimator Apparatus

It will be recognized that while described in the context of an exemplary wireless communications system, the present disclosure is not so limited, and may be utilized within a variety of different applications readily apparent to those of ordinary skill in the art provided the present disclosure, including non-wireless (e.g., wireline or coaxial) systems. The following embodiments are therefore merely illustrative of the broader principles of the disclosure.

Referring now to FIG. 1, an exemplary embodiment of the improved interpolator apparatus 100 according to the disclosure is described. The embodiment of FIG. 1 comprises a noise-shaped frequency-tracking digital sample rate interpolator, and includes an "elastic" storage element 102 (here, an asynchronous FIFO, shown in FIG. 2, although other types of devices may be used to provide this functionality), a digital low pass filter (LPF) 104 which filters and scales the error signal generated in the circuit 100, a noise shaped delta-sigma modulator 106, and a modulo counter 108 that converts the output of the delta-sigma modulator 106 to a clock period. Data is input and output via two respective ports 105, 107 of the storage element 102. The circuit 100 is also provided with an offset input 109 to allow user-selected offsets as described subsequently herein.

As used herein, the term "elastic" refers generally to any component or group of components which act to at least partly decouple one domain from one or more others, or provide buffering therebetween. For example, as described in greater detail below, the exemplary embodiment of the interpolator circuit uses the elastic storage element to substantially decouple or buffer between two clock domains, thereby allowing some degree of independence in their operation.

Figure 2:
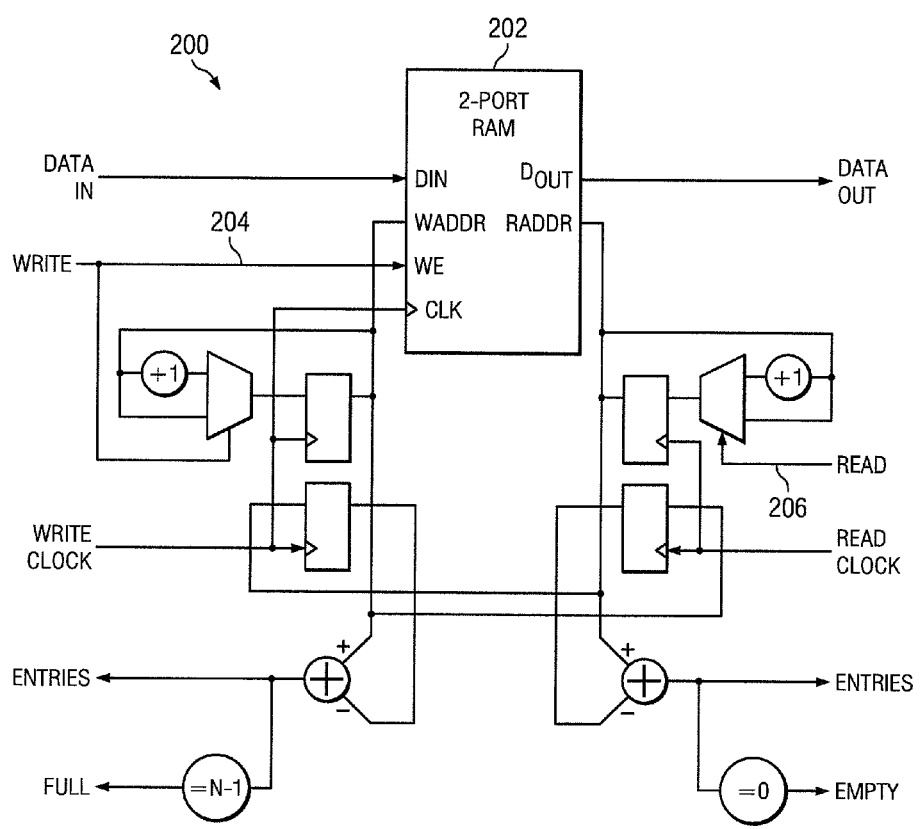
FIG. 2 is a circuit diagram of a first exemplary embodiment of the elastic storage device (and associated components) of the interpolator of FIG. 1.

The exemplary elastic storage device 102 comprises a circuit 200 having an asynchronous FIFO (shown in detail in FIG. 2). The FIFO 102 comprises a multi-port (dual port) RAM 202 with clocked write 204 and asynchronous read 206 of the type well known in the computer arts, although it will be appreciated that other configurations of storage device may be used, the present disclosure not being limited to a dual-port or even multi-port RAM. For example, a single-port storage device adapted for asynchronous accesses by two or more bus masters may be used, assuming the access rates for each master are sufficiently fast. As another alternative, a buffered non-blocking switch fabric of the type well known in the digital processor arts may conceivably be used.

The exemplary dual-port RAM device 202 of FIG. 2 includes inter alia a write enable (WE) port, write address (waddr) and read address (raddr) ports, and a clock port, In the illustrated embodiment, read and write pointers are built with Gray code counters, with the write counter residing in the source clock domain and the read counter residing in the sink (read) clock domain. Both pointers in the circuit 200 of FIG. 2 are re-clocked into the other domain and a current count of entries is calculated in each domain. The count in the slower domain of the circuit 200 of FIG. 2 may contain anomalies due to skew in the re-clocking, and accordingly is not utilized in the illustrated embodiment of FIG. 2 (although it will be recognized that such slower domain clocking may be utilized if the foregoing anomalies are corrected, or for other purposes).

The count in the faster domain (i.e., sink for an interpolator, source for a decimator) is always reliable due to the use of Gray code arithmetic. As is well known. Gray codes (also called cyclical or progressive codes) have historically been useful in mechanical encoders since a slight change in location only affects one bit. However, these same codes offer other benefits well understood to one skilled in the art including being hazard-free for logic and other conditions that could give rise to faulty operation of the circuit. The use of such Gray codes also has important advantages in power saving designs. Because only one bit changes per state change, there is a minimal number of circuit elements involved in switching per input change. This in turn reduces the amount of dynamic power by limiting the number of switched nodes toggled per clock change. Using a typical binary code, up to n bits could change, with up to n subnets changing per clock or input change.

In the context of the illustrated embodiment, the word is being resynchronized across clock boundaries. Since only one bit changes, there is no possibility of getting a wrong value due to clock skew. For example, for the change from decimal "1" to "2" in binary comprises changing from "01" to "10." If the sample clock occurs at the same time the bits are changing, the re-clocked value could be any of 00, 01, 10, or 11, depending on the clock skew and exact relationship between clock and data. Since Gray code is used, the transition is from "01" to "11," and the only possibilities are "01" (clock early) or "11" (clock late).

It will also be appreciated that the above-referenced power savings (reduced switching) may also be realized through the use of Gray codes in, e.g., integrated circuit implementations of the circuits 100, 200.

It is recognized that in the illustrated embodiment, the rate of change of the number of entries in the FIFO 102 is the difference between the source sample rate and the sink sample rate. In other words, the number of entries is the integral of the difference between the source and sink sample rates. This is exactly the signal that is needed as input to the delta-sigma modulator to control the average number of sink clock cycles per source clock cycle (for an interpolator; the opposite is true of a decimator). In practice, this signal is low-pass filtered, and the FIFO 102 is used to absorb short term variations in the ratio of source and sink sample rates. The number of entries in the FIFO 102 sets the range of frequency ratios over which the loop can lock, and an offset can be added to set the midpoint of that range if desired.

The order and bit-width of the delta-sigma modulator 106 is chosen to allow the desired noise shaping within the constraints of the sink to source sample ratio. An offset may be added to the delta-sigma modulator output to set a minimum sample period. The maximum sample period is the offset plus the maximum delta-sigma modulator output (e.g., $2^{bit-width}-1$). In the exemplary configuration, this would be centered around the anticipated source-to-sink sample ratio, although other values may conceivably be used.

Figure 3:
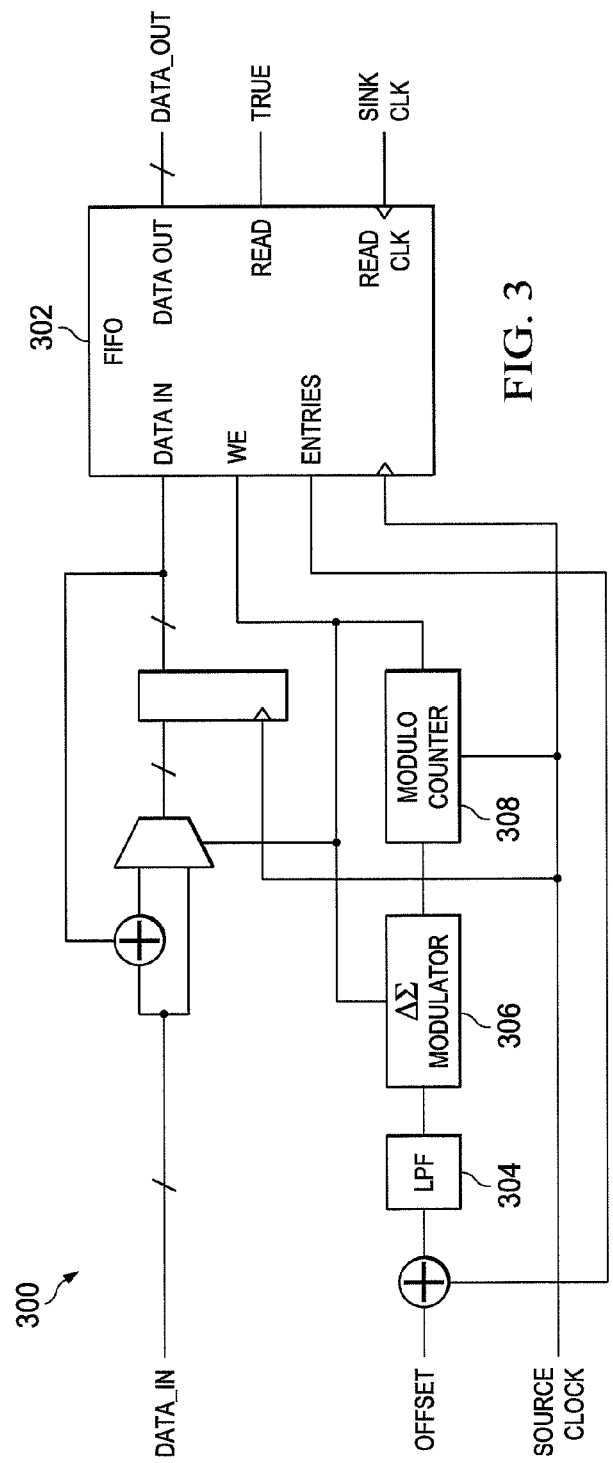
FIG. 3 is a schematic diagram of an exemplary embodiment of a decimator circuit according to the present disclosure.

Referring now to FIG. 3, an exemplary configuration of a noise shaped decimator circuit 300 according to the disclosure is shown. This decimator is basically the dual of the interpolator. In this case, N samples of input data, where N is controlled by the delta-sigma modulator 306 (connected to modulo counter 308), are accumulated and then dumped to the elastic storage element (e.g., FIFO) 302. Since the source clock is now faster than the sink clock, the feedback from the FIFO 302 is taken in the source clock domain, but the rest of the fractional-N locked loop behaves in exactly the same manner as for the interpolator previously described herein with respect to FIG. 1.

Referring now to FIGS. 4-12, an exemplary implementation of a fractional sample rate interpolator (part of an exemplary digital radio architecture described by the co-pending U.S. patent applications previously referenced herein) is discussed in detail for purposes of illustration. It will be recognized that the present disclosure is in no way limited to the details, values, or configuration of the following example.

In the exemplary architecture, the digital samples are being filtered and up-converted from a base-band rate of 1.2288 MHz, to a carrier rate that can vary from 1850 to 1910 MHz. This is done in three stages, where the combined interpolation of the first two stages is 192, and the third stage is implemented using the described disclosure. The base-band frequency and range of carrier frequencies, when taken with the fixed interpolation ratio of 192, imply that the final interpolation will be in the range of approximately 7.7 to 8.1. The example spectra were generated with a ratio of 1880/(1.2288*192) or about 7.9685. With respect to the fractional sample rate converter, this means that the input sample rate is 1.2288 MHz*192=235.9296 MHz, and the output sample rate is 1880 MHz. The receive band is 80 MHz offset above the transmit band. The noise-shaping delta-sigma modulator (coder) must suppress noise at around this frequency with a 1.2288 MHz bandwidth. The coder effectively runs at 1880 MHz. The frequency to be suppressed from quantization noise is therefore 80 MHz*7.9685=637.4783 MHz approximately. The ratio 647.4783/1880=0.33908 approximately, which is the relative normalized frequency we must place a null at in the noise shaping coder for noise suppression.

Figure 4:
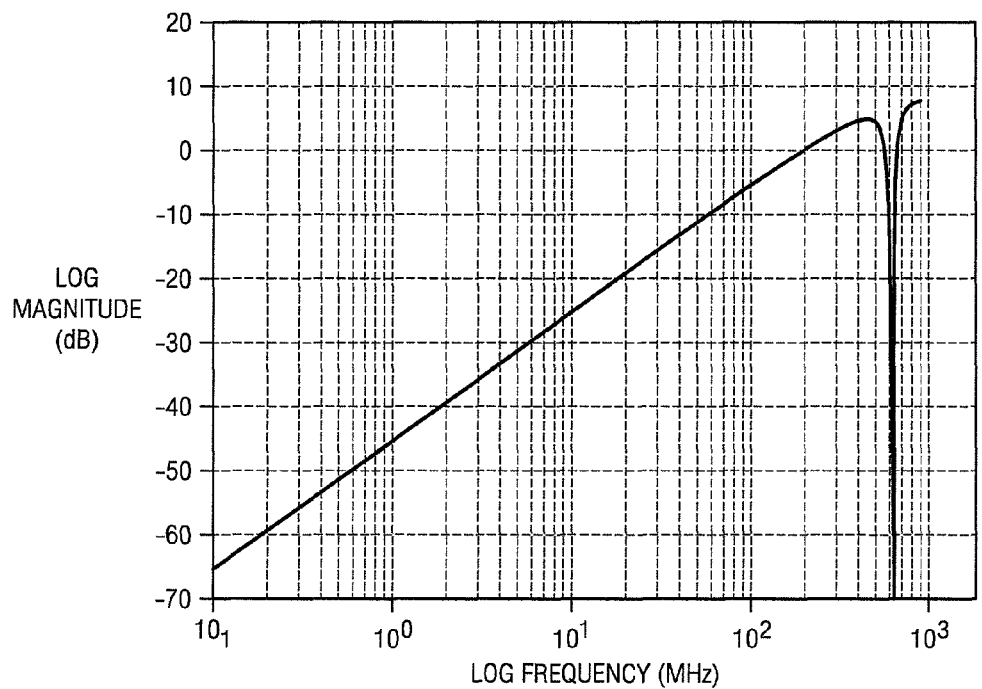
FIG. 4 is a plot of the noise transfer function of an exemplary coder (fifth order) according to the disclosure, showing the notch at 637.4783 MHz with respect to the sample rate of 1880 MHz.

FIG. 4 is a plot of the noise transfer function of the coder, showing the notch at 637.4783 MHz approximately.

Figure 5:
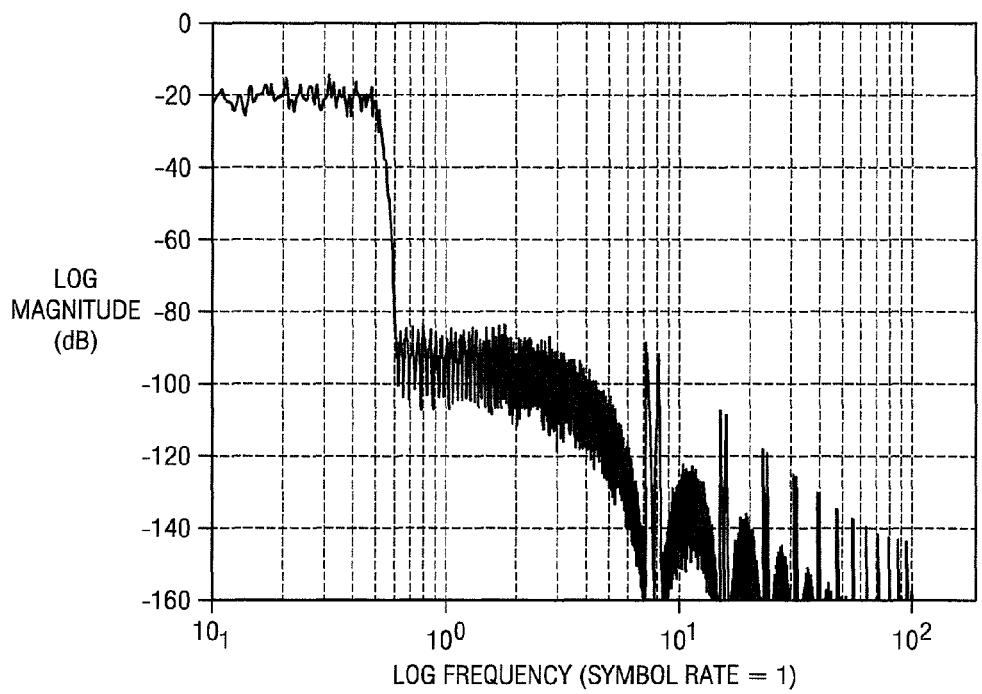
FIG. 5 is a graphical representation of a spectrum generated using integer (non-fractional) interpolation of the combined interpolation and filtering stages.

FIG. 5 is a spectrum using integer (non-fractional) interpolation of the combined interpolation and filtering stages.

Figure 6:
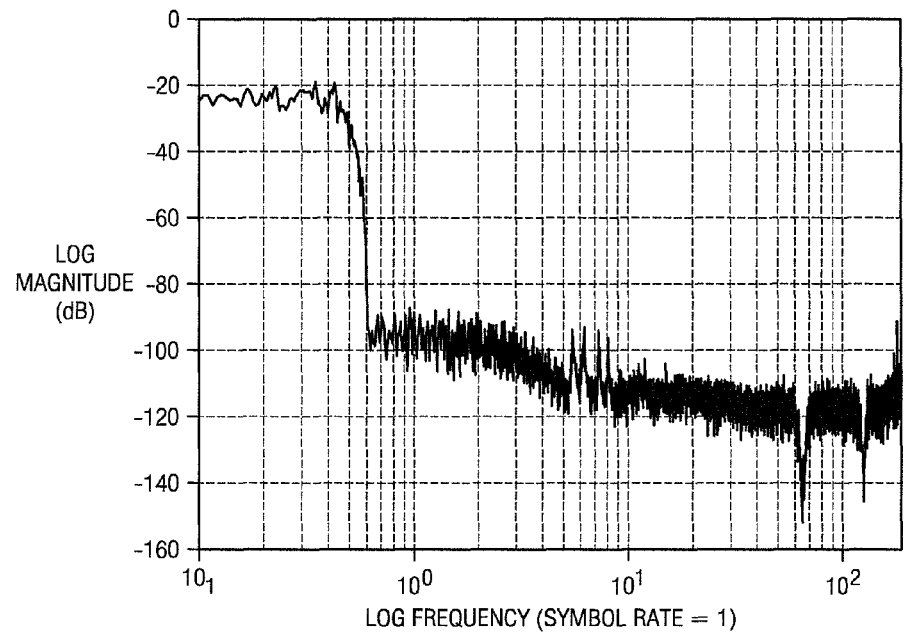
FIG. 6 is a graphical representation of a spectrum generated using the fractional sample rate converter, of the combined interpolation and filtering stages.

FIG. 6 is a spectrum, using the fractional sample rate converter, of the combined interpolation and filtering stages.

Figure 7:
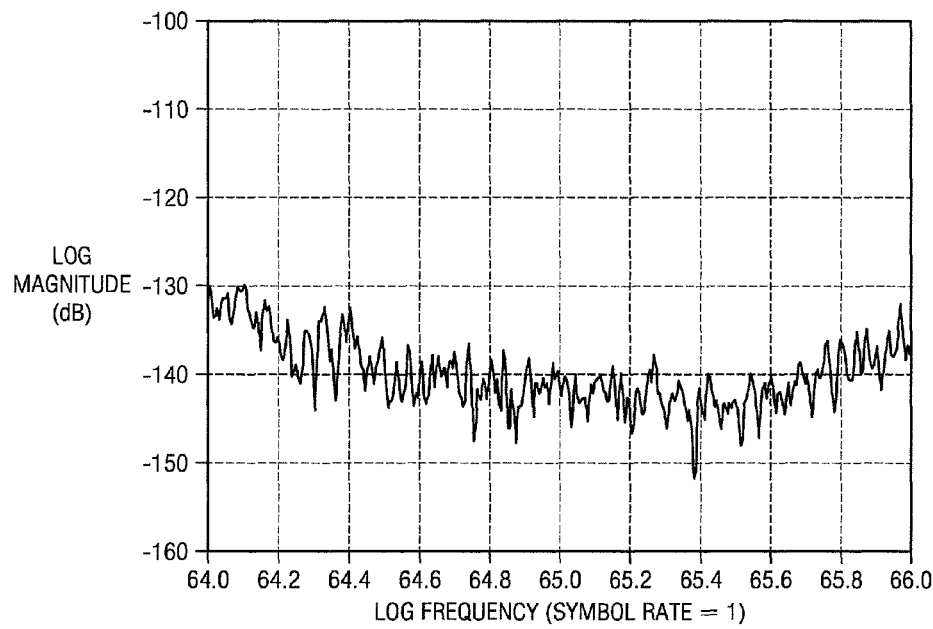
FIG. 7 is a detail view of the spectrum of FIG. 6, specifically at the notch frequency corresponding to the receive band.

FIG. 7 is a focus view of FIG. 6 at the notch frequency location of interest corresponding to the receive band. The frequency scales of FIGS. 5, 6, 7, 8, and 9 are calibrated with respect to the symbol rate. Therefore, the 80 MHz frequency is 80/1.2288=65.1 with respect to the symbol rate.

Figure 8:
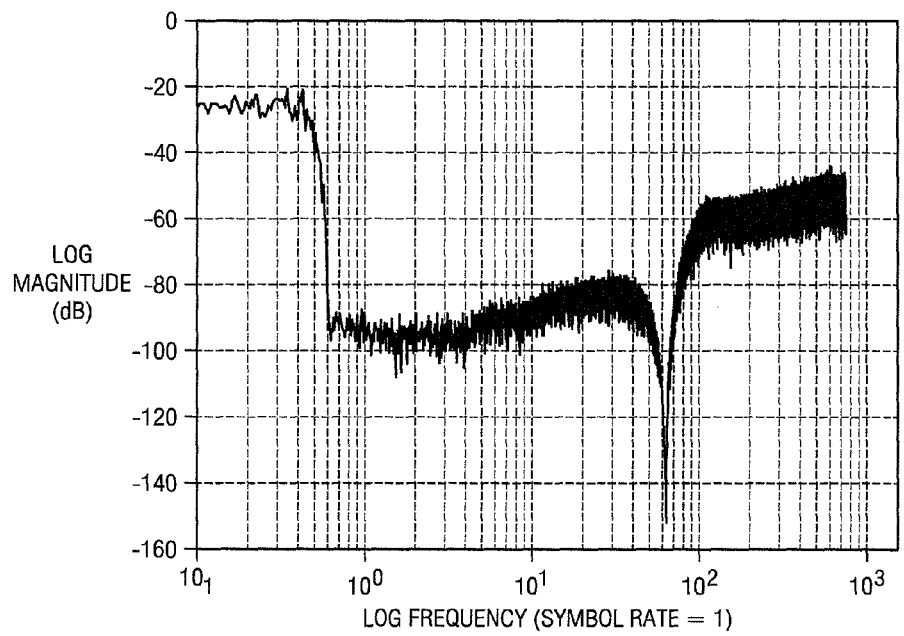
FIG. 8 is a graphical representation of an exemplary spectrum of the output of an I-coder following the fractional rate interpolator.
Figure 9:
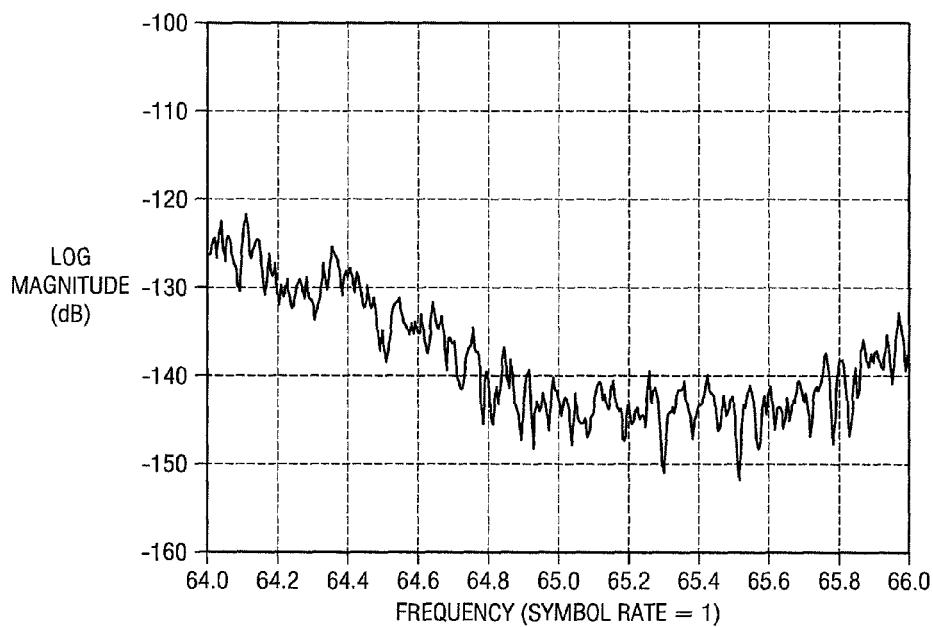
FIG. 9 is a graphical representation of the spectral output of an exemplary I-coder (partial view)

FIG. 8 is a spectrum of the output of the I-coder that follows the fractional rate interpolator, and FIG. 9 is a focus view thereof.

Figure 10:
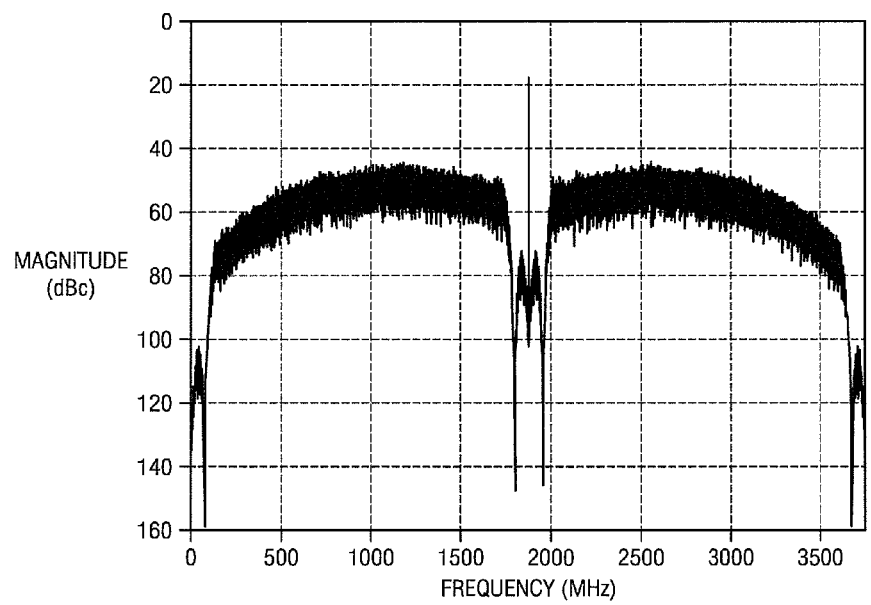
FIG. 10 is a graphical representation of an exemplary spectrum of the output of the digital transmitter that combines and upconverts the I and Q coders.

FIG. 10 is a spectrum of the output of the digital transmitter that combines and upconverts the I and Q coders.

Figure 11:
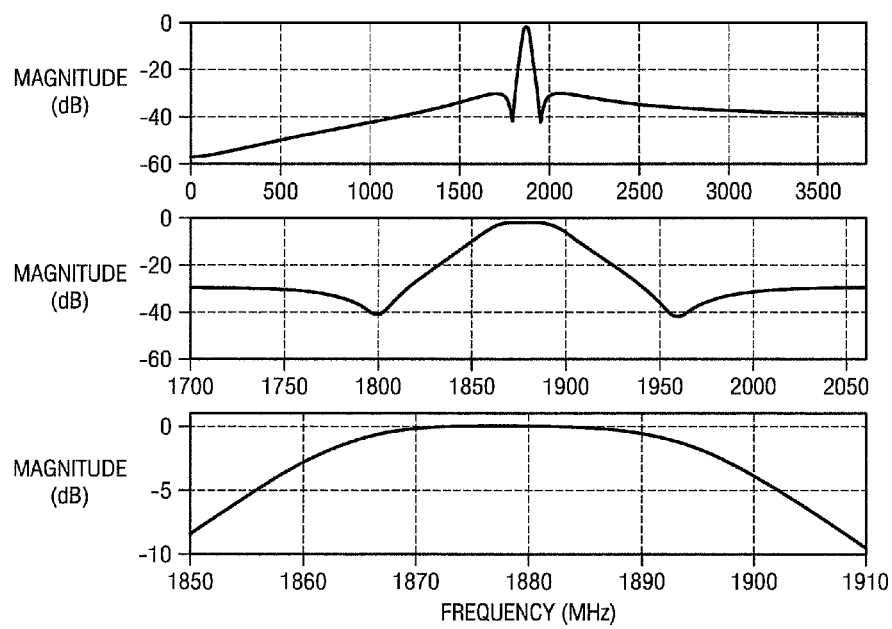
FIG. 11 shows the frequency response for an exemplary bandpass filter/RF resonator/duplexer configuration according to the disclosure.
Figure 12:
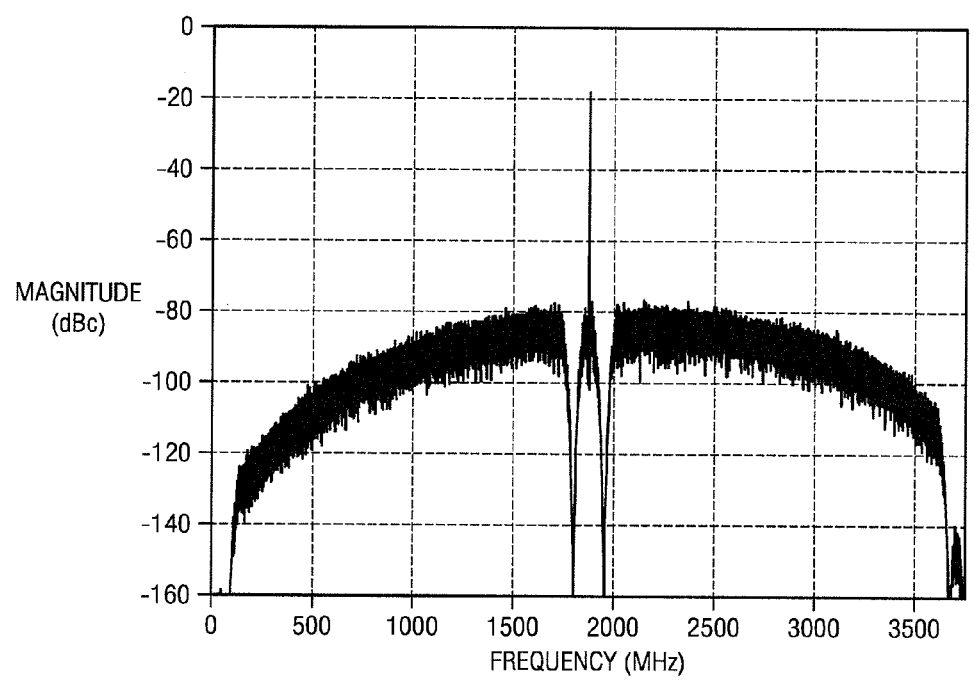
FIG. 12 is an exemplary output spectrum of the exemplary digital transmitter of the disclosure after the analog bandpass filter and RF resonator and duplexer.

FIG. 11 shows the frequency response of the RF resonator/duplex filter, and FIG. 12 is a spectrum of the digital transmitter after the RF resonator/duplexer is applied. The noise in the receive band is not appreciably degraded by the fractional sample rate converter.

RF System with Interpolator/Decimator

Figure 13:
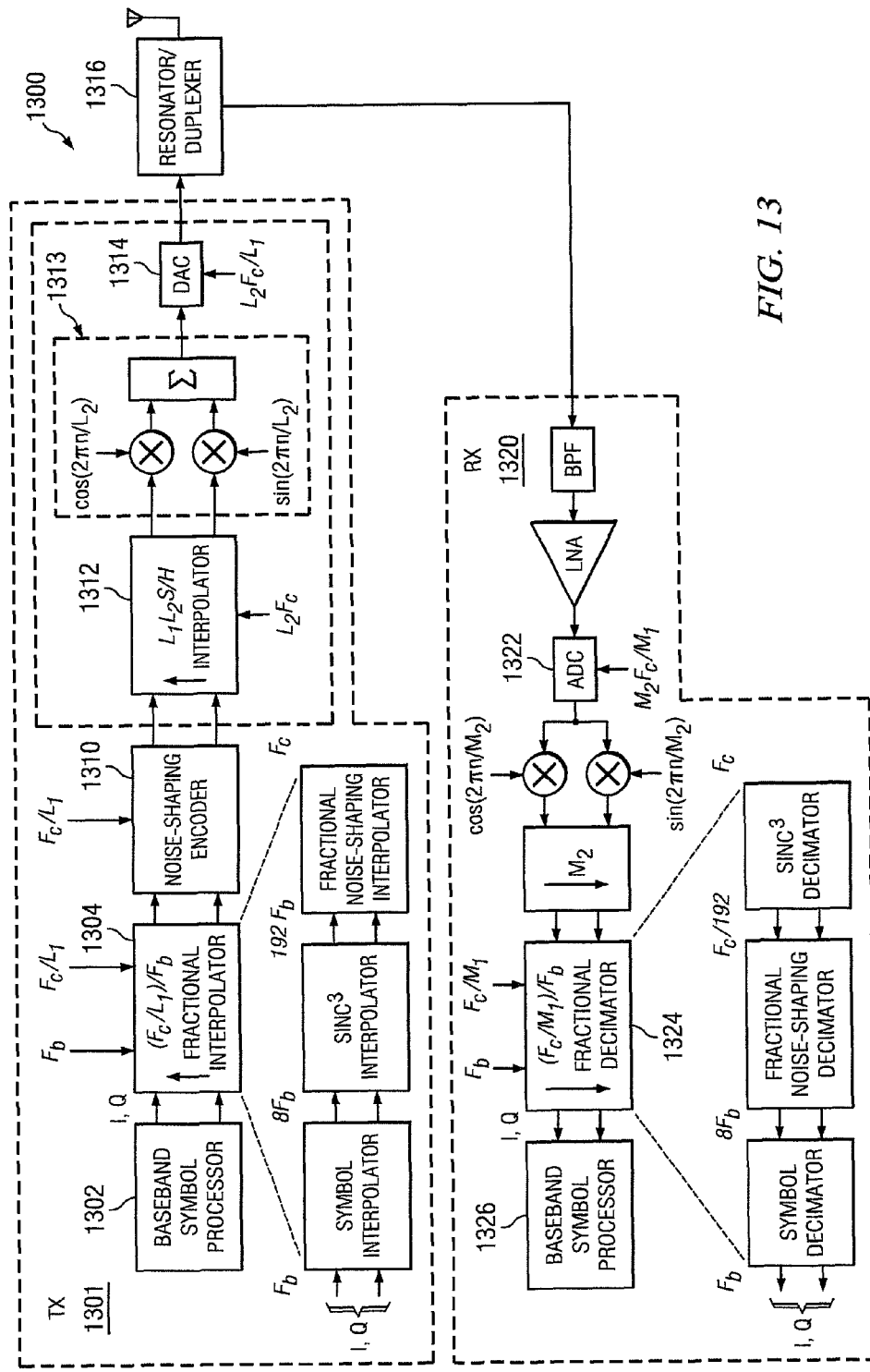
FIG. 13 is a functional block diagram of an exemplary radio frequency transceiver circuit incorporating both the interpolator and decimator apparatus of the present disclosure.

Referring now to FIG. 13, an exemplary radio frequency transceiver system utilizing the improved converter of the present disclosure is described.

In one embodiment, the transceiver 1300 comprises a transmitter section 1301 with baseband processor 1302, a fractional interpolator 1304 (such as that described herein), noise shaping coder (NSC) 1310, sample and hold interpolator 1312, a digital I/Q quadrature mixer and combiner 1313, and a high-efficiency DAC 1314 (such as that described in U.S. Pat. No. 7,116,253. A resonator (not shown) is also utilized in conjunction with the duplexer 1316 to generate the analog output of the transmitter. As described in detail in co-owned and co-pending U.S. Pat. No. 7,924,937, the interpolator, NSC, DAC and resonator cooperate to convert the digital in-phase (I) and quadrature (Q) signals obtained from the baseband processor directly to an analog representation at carrier frequency for transmission over an antenna in a highly power-efficient manner. In one variant, the transmitter is further adapted to dislocate quantization noise generated by the transmitter outside of one or more receive bands associated with a related receiver unit of the transmitter.

The transceiver circuit 1300 of FIG. 13 also includes a receiver section 1320 including the duplexer 1316, analog-to-digital converter (ADC) 1322, fractional decimator 1324 (which includes the fractional noise-shaping decimator described herein), and baseband processor 1326 (which may or may not be the same baseband processor 1302 as described above). The received signals are duplexed and sent to the ADC (via a bandpass filter and low noise amplifier), wherein they are converted to the digital domain. Here the fractional noise-shaping decimator decimates the signal and ultimately (with the aid of other decimation) produces the digital in-phase (I) and quadrature (Q) signals which may then be processed by the baseband processor.

Alternate Embodiments

In another aspect of the disclosure, an improved RF device and method of operating the same is disclosed. Referring to FIGS. 14-18, the present disclosure also optionally includes a means for reducing the sensitivity to phase noise and causing less degradation in the receive band, which may be offset in frequency from the transmit band in a full duplex transceiver.

In one exemplary embodiment of the architecture employing this improvement, a fractional-N phase lock loop (PLL) is provided having a modulus update frequency at a multiple or sub-multiple of the receive frequency offset from the transmitter. For example, in a CDMA system, the receive frequency is typically 80 MHz above the transmit frequency. If the modulus updates at 80 MHz, or even 40 MHz or 20 MHz, etc., then sin(x)/x nulls will occur at multiples of the update rate. It will be recognized that this feature is not limited to only receive frequency offsets, but rather may be based on any value (or offset) if desired.

It will also be appreciated that the present disclosure can be used with a variable coder as well, such as for example the variable order coder described in U.S. Pat. No. 7,561,635.

Figure 14:
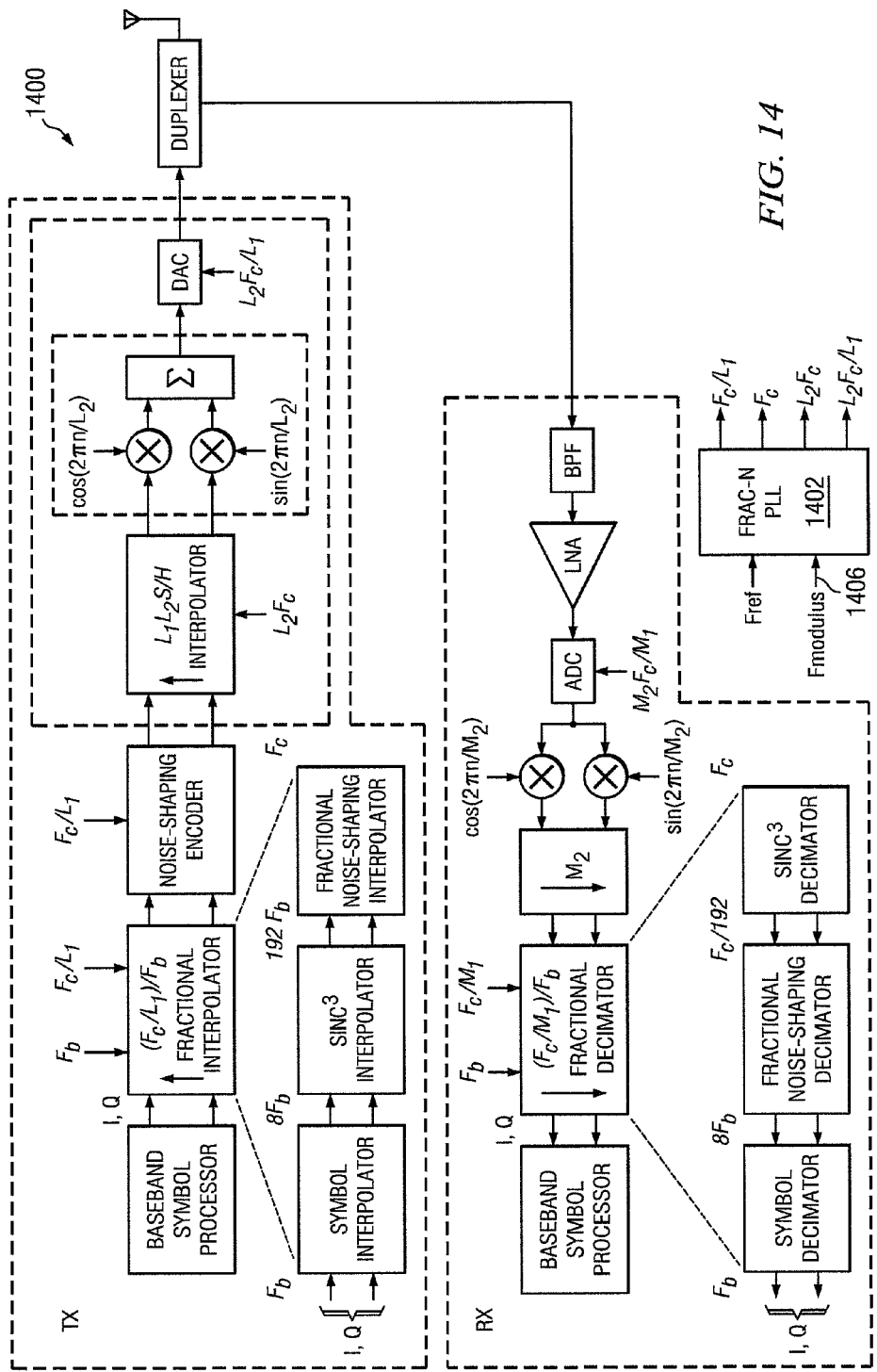
FIG. 14 is a functional block diagram of another embodiment of a radio frequency transceiver circuit according to the present disclosure, incorporating a phase-lock loop (PLL) arrangement.

FIG. 14 shows an exemplary embodiment of a PLL-based transceiver apparatus 1400. In this embodiment, the baseband clocks related to $F_b$ are derived from an independent clock source, and the carrier-related clocks related to $F_c$ are derived from an independent PLL 1402 with a modulus update frequency control signal, $F_{modulus}$ 1406. The PLL 1402 may be of the type ordinary in the art, such as a Fractional-N synthesis PLL (as shown) or a delta-sigma PLL, or any other structure which provides the aforementioned functionality. As will be appreciated, this approach can be applied to both the interpolator and decimator circuits.

Figure 15:
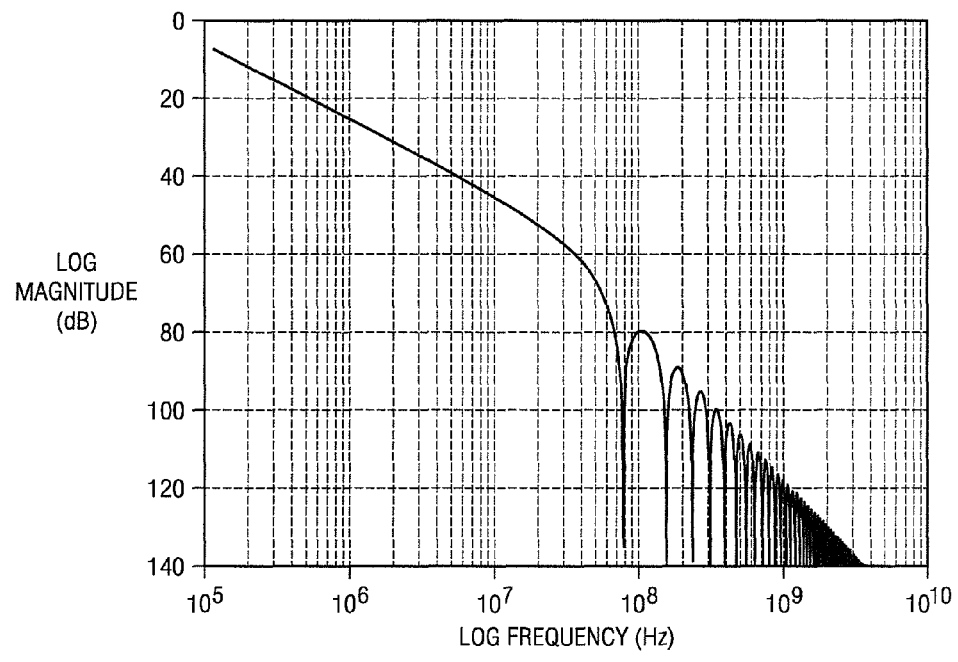
FIG. 15 is a graphical representation of an exemplary digital transmitter showing the phase noise transfer function of the VCO output of a fractional-N delta-sigma PLL having sin(x)/x sampling nulls occurring at multiples an exemplary receiver frequency offset (e.g., 80 MHz) from the transmitter.

FIG. 15 is a plot of the phase noise transfer function of the VCO of a fractional-N phase lock loop (PLL) (such as that of FIG. 14) having a modulus update rate of 80 MHz. Advantageously, there is significant attenuation at 80 MHz, as opposed to the single-pole roll-off that occurs at lower frequencies.

Figure 16:
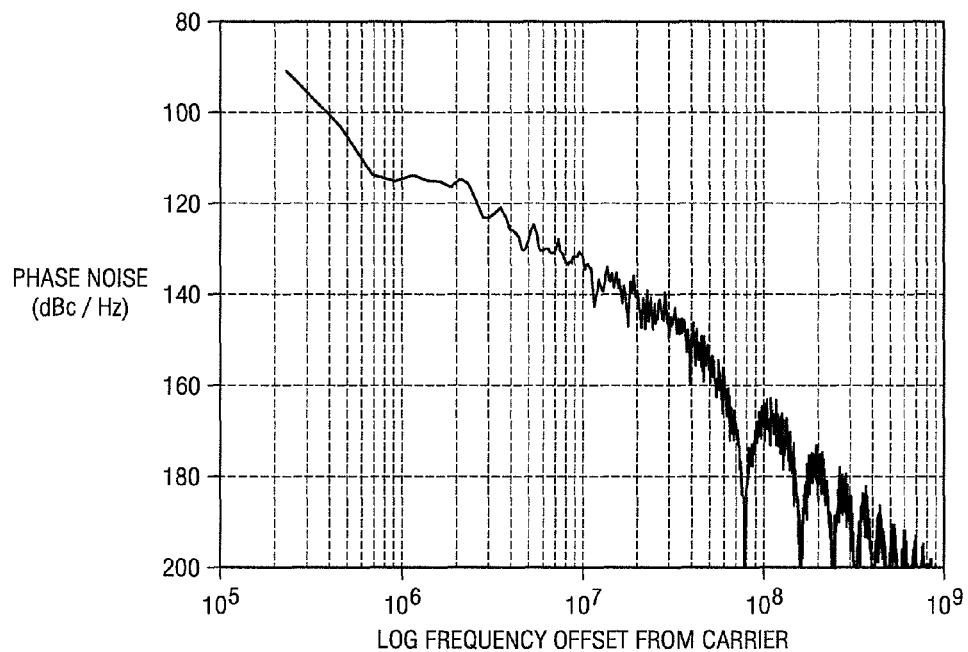
FIG. 16 is a graphical representation of an exemplary digital transmitter showing the phase noise profile of the VCO output of fractional-N delta-sigma PLL having sin(x)/x sampling nulls occurring at multiples of the receiver frequency offset from the transmitter.

FIG. 16 is a plot of the phase noise profile that follows FIG. 15.

Figure 17:
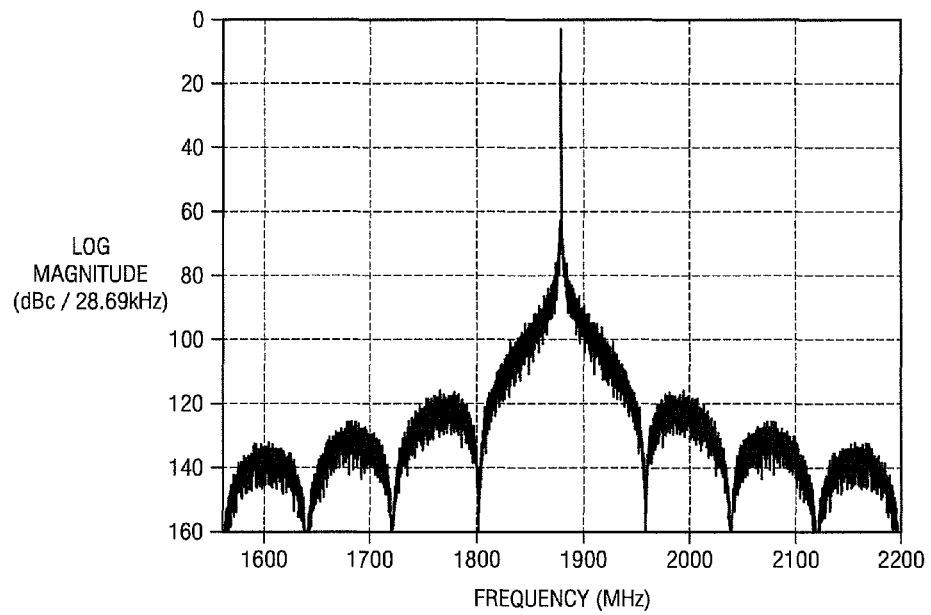
FIG. 17 is a graphical representation of an exemplary digital transmitter showing the output with a pure carrier, using a fractional-N delta-sigma PLL having sin(x)/x sampling nulls occurring at multiples of the receive frequency offset from the transmitter.

FIG. 17 is a plot of a pure transmit carrier frequency, i.e., an unmodulated periodic sequence of {1,0,−1,0}, but with jittered sampling edges in accordance with the phase noise profile that follows from FIG. 16. The noise at 80 MHz offset in a 1.2288 MHz bandwidth is −168 dBm/Hz, where the transmit power is +28 dBm.

Figure 18:
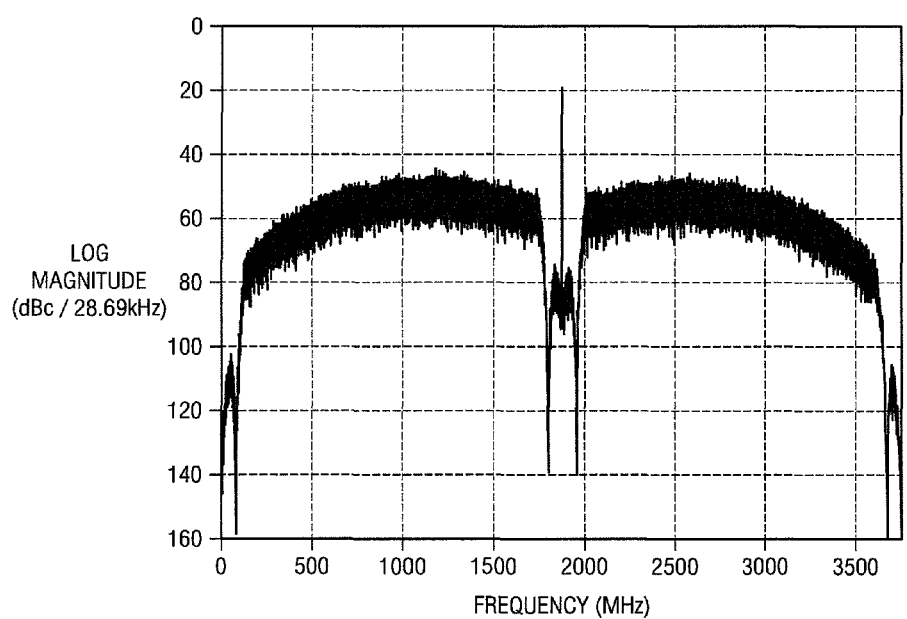
FIG. 18 is a graphical representation of an exemplary digital transmitter showing the spectral output of the overall digital transmitter prior to analog bandpass filter/duplexer, but with phase noise in accordance with FIGS. 15, 16, and 17.

FIG. 18 is a plot of the actual modulated sequence having jittered sampling edges in accordance with the phase noise profile that follows from FIG. 16. This plot, FIG. 18, can be compared with that of FIG. 10. The noise at 80 MHz offset in a 1.2288 MHz bandwidth is −149 dBm/Hz, as opposed to −153 dBm/Hz in the ideal case without jitter or phase noise. It should be noted that if the same duplexer/resonator is applied (as comparing FIG. 10 with FIG. 12), then the receive noise is additionally suppressed by another 40 dB or so using the aforementioned techniques.

It will be further recognized that the disclosed techniques for reducing phase noise (e.g., in the receive band(s)) may be used selectively with respect to the other aspects of the present disclosure. For example, it is contemplated that the modulus update frequency of the aforementioned fractional-N phase lock loop may be dynamically or selectively varied depending on various factors including the need for further suppression in the receive band, power consumption, etc. The fractional-N PLL may also be selectively switched in or out if desired as well, and/or put into a "sleep" mode under certain operating conditions to conserve power. Myriad different schemes for selectively utilizing and/or controlling the operation of the fractional-N PLL may be used consistent with the disclosure, as will be recognized by those of ordinary skill when provided the present disclosure.

It can be appreciated that the various circuits of the present disclosure may be rendered as stand-alone or discrete electronic circuits, as well as integrated circuit (IC) devices. Such integrated circuit devices may include, for example, system-on-chip (SoC) devices which integrate multiple functions or modules onto a single semiconductive die rendered in a sub-micron SiGe process. For example, in one embodiment of the present disclosure, the interpolator (and/or decimator) circuits are included with the digitally switched resonator, noise shaping coder, etc. of the direct-conversion architecture referenced above. Baseband processing may also optionally be included within this device. This highly integrated approach provides significant benefits in terms of size and compactness, power consumption, and ease of design and implementation. It also leverages one of the primary benefits of the exemplary direct-conversion architecture described above; i.e., simplification and obviation of many prior art RF amplifier and up-conversion/down-conversion components that would otherwise be provided as discrete devices.

It will be recognized that while certain aspects of the disclosure are described in terms of a specific sequence of steps of a method or ordering of components in an apparatus adapted to implement the methodology of the disclosure, these descriptions are only illustrative of the broader disclosure, and may be modified as required by the particular application. Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. The foregoing description is of the best mode presently contemplated of carrying out the disclosure. This description is in no way meant to be limiting, but rather should be taken as illustrative of the general principles of the disclosure. The scope of the disclosure should be determined with reference to the claims.

What is claimed is:

1. A radio frequency apparatus comprising a delta-sigma phase-locked loop (PLL) oscillator having a modulus that is updated at a modulus update frequency, wherein the modulus update frequency is one of a multiple or sub-multiple of an offset between a receive frequency of the radio frequency apparatus and a transmit frequency of the radio frequency apparatus.

2. The apparatus of claim 1, wherein the radio frequency apparatus comprises a code division multiple access (CDMA) mobile unit.

3. The apparatus of claim 1, wherein the modulus update frequency is a variable frequency which changes during operation of the radio frequency apparatus.

4. The apparatus of claim 3, wherein the variable frequency is dynamically varied as a function of at least one parameter selected from the group consisting of: (i) radio frequency apparatus transmitter power, and (ii) an order of the delta-sigma PLL.

5. A method of suppressing phase noise in a radio frequency device utilizing a transmit frequency and a receive frequency, the method comprising:
  providing a phase lock loop (PLL) having a modulus; and
  updating the modulus at a modulus update frequency comprising a multiple or sub-multiple of an offset between the receive frequency and the transmit frequency,
  wherein phase noise generated by the PLL at the receive frequency is reduced.

6. The method of claim 5, wherein the PLL is a fractional-N delta-sigma PLL.

7. The method of claim 5, wherein the radio frequency device comprises a code division multiple access (CDMA) mobile unit.

8. The method of claim 5, wherein the modulus update frequency is a variable frequency that changes during operation of the radio frequency device.

9. The method of claim 8, wherein the variable frequency is dynamically varied as a function of at least one parameter selected from the group consisting of: (i) transmitter power, and (ii) an order of the PLL.

10. A circuit, comprising:
a radio frequency device utilizing a transmit frequency and a receive frequency; and
a phase lock loop (PLL) having a modulus that is updated at a modulus update frequency comprising a multiple or sub-multiple of an offset between the receive frequency and the transmit frequency so as to reduce phase noise generated by the PLL at the receive frequency.

11. The circuit of claim 10, wherein the PLL is a fractional-N delta-sigma PLL.

12. The circuit of claim 10, wherein the radio frequency device comprises a code division multiple access (CDMA) mobile radio.

13. The circuit of claim 10, wherein the modulus update frequency variably changes during operation of the radio frequency device.

14. The circuit of claim 10, wherein the modulus update frequency is dynamically varied as a function of at least one parameter selected from the group consisting of: (i) transmitter power, and (ii) an order of the PLL.

15. A radio frequency apparatus comprising: a fractional-N oscillator having a modulus that is updated with a modulus update frequency that is a multiple or sub-multiple of an offset between a receive frequency of the radio frequency apparatus and a transmit frequency of the radio frequency apparatus.

16. The apparatus of claim 15, wherein the fractional-N oscillator comprises a delta-sigma phase-locked loop (PLL).

17. The apparatus of claim 15, wherein the radio frequency apparatus comprises a code division multiple access (CDMA) mobile radio.

18. The apparatus of claim 15, wherein the modulus update frequency is a variable frequency that changes during operation of the radio frequency apparatus.

19. The apparatus of claim 18, wherein the variable frequency for the modulus update frequency is dynamically varied as a function of at least one parameter selected from the group consisting of: (i) radio frequency apparatus transmitter power, and (ii) an order of the fractional-N oscillator.

* * * * *